US012593529B2

(12) United States Patent
Li et al.

(10) Patent No.: US 12,593,529 B2
(45) Date of Patent: Mar. 31, 2026

(54) BACK STRUCTURE OF SOLAR CELL, AND SOLAR CELL WITH BACK STRUCTURE

(71) Applicant: CHINT NEW ENERGY TECHNOLOGY CO., LTD., Jiaxing (CN)

(72) Inventors: Hongbo Li, Jiaxing (CN); Sheng He, Jiaxing (CN); Wei Shan, Jiaxing (CN); Wei-Chih Hsu, Hsinchu (TW); Xinlin Zeng, Jiaxing (CN); Yingcai Zhao, Jiaxing (CN)

(73) Assignee: CHINT NEW ENERGY TECHNOLOGY CO., LTD., Jiaxing (CN)

( * ) Notice: Subject to any disclaimer, the term of this patent is extended or adjusted under 35 U.S.C. 154(b) by 186 days.

(21) Appl. No.: 18/035,094

(22) PCT Filed: Feb. 2, 2021

(86) PCT No.: PCT/CN2021/074774
§ 371 (c)(1),
(2) Date: May 2, 2023

(87) PCT Pub. No.: WO2022/141738
PCT Pub. Date: Jul. 7, 2022

(65) Prior Publication Data
US 2024/0014329 A1     Jan. 11, 2024

(30) Foreign Application Priority Data

Dec. 29, 2020     (CN) .......................... 202011594855.3

(51) Int. Cl.
*H10F 77/30*     (2025.01)
*H10F 10/14*     (2025.01)

(52) U.S. Cl.
CPC ......... *H10F 77/311* (2025.01); *H10F 10/146* (2025.01)

(58) Field of Classification Search
None
See application file for complete search history.

(56) References Cited

U.S. PATENT DOCUMENTS

| | | | |
|---|---|---|---|
| 9,722,104 B2 | 8/2017 | Ha | |
| 2011/0094586 A1* | 4/2011 | Cheong | H01L 31/02168 |
| | | | 257/E31.127 |
| 2022/0059718 A1* | 2/2022 | Yuan | H01L 31/02167 |

FOREIGN PATENT DOCUMENTS

| | | |
|---|---|---|
| CN | 205194711 U | 4/2016 |
| CN | 105845747 A | 8/2016 |
| CN | 106169510 A | 11/2016 |
| CN | 106206757 A | 12/2016 |
| CN | 106537486 A | 3/2017 |
| CN | 107256894 A | 10/2017 |
| CN | 107256898 A | 10/2017 |
| CN | 109509796 A | 3/2019 |
| CN | 110391304 A | 10/2019 |
| CN | 110459615 A | 11/2019 |
| CN | 110957378 A | 4/2020 |
| CN | 109087956 B | 7/2020 |
| CN | 111378958 A | 7/2020 |
| CN | 111668317 A | 9/2020 |
| CN | 211654848 U | 10/2020 |
| EP | 2698825 A1 | 2/2014 |

OTHER PUBLICATIONS

English language machine translation of CN 109509796 A. (Year: 2024).*
English language machine translation of CN 110 391 304 A. (Year: 2024).*
English language machine translation of CN 110 957 378 A. (Year: 2024).*
The extended European search report of the corresponding EP patent application No. 21912516.8, mail date Apr. 25, 2024.
The examination report No. 1 of the corresponding AU patent application No. 2021411203, mail date Mar. 8, 2024.
The Office Action of the corresponding IN patent application No. IN202317033211, mail date Nov. 10, 2025.

* cited by examiner

*Primary Examiner* — Eli S Mekhlin
(74) *Attorney, Agent, or Firm* — The Sun IP Law

(57)     ABSTRACT

Some embodiments of the present disclosure provide a back structure of a solar cell. The back structure includes an aluminum oxide film layer disposed on a silicon wafer substrate, and a first silicon nitride film layer and a first silicon oxynitride film layer, which are successively disposed on the aluminum oxide film layer from inside to outside; and the back structure further includes a second silicon nitride film layer disposed on the first silicon oxynitride film layer. The refractive index of the first silicon nitride film layer is greater than that of the second silicon nitride film layer, and the refractive index of the second silicon nitride film layer is greater than that of the first silicon oxynitride film layer.

11 Claims, No Drawings

BACK STRUCTURE OF SOLAR CELL, AND SOLAR CELL WITH BACK STRUCTURE

CROSS-REFERENCE TO RELATED DISCLOSURE

The present disclosure is a national stage disclosure of International Patent Disclosure No. PCT/CN2021/074774, which is filed on Feb. 2, 2021, and claims priority to Chinese Patent Disclosure No. 202011594855.3, filed on Dec. 29, 2020 and entitled "Back Structure of Solar Cell, and Solar Cell with Back Structure", the contents of which are hereby incorporated by reference in its entirety.

TECHNICAL FIELD

The present disclosure relates to a technical field of back structures of solar cells, and specifically to a back structure of a solar cell, and a solar cell with the back structure.

BACKGROUND

Deposition of silicon nitride on a back surface of a solar photovoltaic cell using a Plasma Enhanced Chemical Vapor Deposition (PECVD) technology is an important process step to achieve interface passivation, reflection increasing and protection of an alumina film layer.

In an existing solar cell, such as a double-sided Passivated Emitter and Rear Cell (PERC) solar cell, the back surface is a film in which aluminum oxide is superimposed with silicon nitride. In a process of preparing the PERC cell, in order to meet requirements of an interface state with a small back face, internal reflection of long-wave light and H passivation, an aluminum oxide+silicon nitride structure is generally used to process the back face. Under a general trend of cost reduction and efficiency increase, continuing to improve a surface passivation effect has become a key technical problem to be overcome.

However, a film layer structure known to inventors in which alumina is superimposed with silicon nitride is difficult to achieve higher field passivation and H passivation requirements, affecting the performance indexes of the solar cell, for example, improvement of Uoc, Isc, Eta and conversion efficiency.

SUMMARY

In order to follow a passivation requirement trend of solar cells so as to improve the performance of the solar cells, some embodiments of the present disclosure are intended to provide a back structure of a solar cell, to meet a passivation requirement of the solar cell, so as to improve the performance of the solar cell.

Some embodiments of the present disclosure are further intended to provide a solar cell with the back structure.

Some embodiments of the present disclosure provide the following technical solutions.

A back structure of a solar cell includes an aluminum oxide film layer disposed on a silicon wafer substrate of the solar cell, and a first silicon nitride film layer and a first silicon oxynitride film layer, which are successively disposed on the aluminum oxide film layer from inside to outside. A refractive index of the first silicon nitride film layer is greater than a refractive index of the first silicon oxynitride film layer.

In the back structure of a solar cell of the present disclosure, by means of disposing the first silicon nitride film layer and the first silicon oxynitride film layer on the aluminum oxide film layer, and making a refractive index of the first silicon oxynitride film layer less than that of the first silicon nitride film layer, the passivation requirement of the solar cell is met, and the performance of the solar cell is improved.

In some embodiments, the back structure further includes a second silicon nitride film layer disposed on the first silicon oxynitride film layer. The refractive index of the first silicon nitride film layer is greater than a refractive index of the second silicon nitride film layer, and a refractive index of the second silicon nitride film layer is greater than the refractive index of the first silicon oxynitride film layer. On the basis of the first silicon nitride film layer and the first silicon oxynitride film layer, the second silicon nitride film layer is further disposed, such that alternate arrangement of the silicon oxynitride film layer and the silicon nitride film layer is realized; and a refractive index of the intermediate silicon oxynitride film layer is less than a refractive index of the silicon nitride film layers on the two sides, and the overall refractive index of the silicon nitride film layers successively decreases from inside to outside.

In some embodiments, the refractive index of the first silicon nitride film layer is 2.3-2.4, and a film thickness of the first silicon nitride film layer is 10-25 nm; the refractive index of the second silicon nitride film layer is 1.9-2.2, and a film thickness of the second silicon nitride film layer is 30-60 nm; and the refractive index of the first silicon oxynitride film layer is 1.7-1.9, and a film thickness of the first silicon oxynitride film layer is 10-20 nm. Through research, the inventor has discovered that, when the silicon oxynitride film layer is the outermost layer, the refractive index and the film thickness selected for the silicon oxynitride film layer also be selected to be larger and thicker.

In some embodiments, the second silicon nitride film layer includes at least one sub silicon nitride film layer; and the refractive index of the sub silicon nitride film layer successively decreases from inside to outside.

In some embodiments, at least one sub silicon nitride film layer includes a first sub silicon nitride film layer, a second sub silicon nitride film layer and a third sub silicon nitride film layer, which are successively disposed on the first silicon oxynitride film layer from inside to outside; a refractive index of the first sub silicon nitride film layer is 2.1-2.2, and a film thickness of the first sub silicon nitride film layer is 15-25 nm; a refractive index of the second sub silicon nitride film layer is 2.0-2.1, and a film thickness of the second sub silicon nitride film layer is 8-15 nm; a refractive index of the third sub silicon nitride film layer is 1.9-2.0, and a film thickness of the third sub silicon nitride film layer is 8-15 nm.

In some embodiments, the back structure further includes a second silicon oxynitride film layer disposed on the second silicon nitride film layer. A refractive index of the second silicon oxynitride film layer is 1.7-2.0, and a film thickness of the second silicon oxynitride film layer is 8-15 nm. By means of disposing the second silicon oxynitride film layer on the outer side, a structure of alternately arranging the silicon nitride film layer and the silicon oxynitride film layer is further strengthened, such that the performance of the solar cell is improved, and energy conversion efficiency and double-sided efficiency are improved.

In some embodiments, the back structure further includes a silicon oxide film layer disposed on the second silicon oxynitride film layer; and a refractive index of the silicon oxide film layer is 1.5-1.6, and a film thickness of the silicon oxide film layer is 8-15 nm. Performance improvement of the back structure is further strengthened by means of the silicon oxide film layer.

Some embodiments of the present disclosure further provide a PERC solar cell including the above back structure of a solar cell.

Some embodiments of the present disclosure further provide a TOPCon solar cell including the above back structure of a solar cell.

Some embodiments of the present disclosure have the following beneficial effects.

Applying the technical solution of this disclosure, by means of disposing the silicon nitride film layers and the silicon oxynitride film layers, and making the silicon oxynitride film layers and the silicon nitride film layers arranged relatively alternately, a passivation requirement of the solar cell can be met, and performance indexes such as Uoc, Isc, FF and Eta of the solar cell can be mainly improved. The back structure is applied to a double-sided or single-sided PERC solar cell and a TOPCon solar cell, such that the efficiency of the solar cells can be improved.

DETAILED DESCRIPTION OF THE EMBODIMENTS

Specific implementations of the present disclosure are further described below.

Unless otherwise specified, raw materials used in the present disclosure are commercially available or commonly used in the art; and unless otherwise specified, methods in the following embodiments are conventional in the art.

Embodiment 1

A back structure of a solar cell includes a silicon wafer substrate. An aluminum oxide film layer is firstly deposited on the back face of the silicon wafer substrate; and then a first silicon nitride film layer and a first silicon oxynitride film layer are successively deposited. A refractive index of the first silicon nitride film layer is greater than a refractive index of the first silicon oxynitride film layer; the refractive index of the first silicon nitride film layer is 2.35, and a film thickness of the first silicon nitride film layer is 33 nm; and the refractive index of the first silicon oxynitride film layer is 2.0, and a film thickness of the first silicon oxynitride film layer is 45 nm.

Embodiment 2

A back structure of a solar cell includes a silicon wafer substrate. The difference between this embodiment and Embodiment 1 lies in that, a second silicon nitride film layer is further deposited on the first silicon oxynitride film layer. A refractive index of the second silicon nitride film layer is greater than the refractive index of the first silicon oxynitride film layer and less than the refractive index of the first silicon nitride film layer; the refractive index of the first silicon nitride film layer is 2.35, and a film thickness of the first silicon nitride film layer is 33 nm; the refractive index of the first silicon oxynitride film layer is 1.8, and a film thickness of the first silicon oxynitride film layer is 20 nm; and the refractive index of the second silicon nitride film layer is 1.9, and a film thickness of the second silicon nitride film layer is 38 nm.

Embodiment 3

A back structure of a solar cell includes a silicon wafer substrate. The difference between this embodiment and Embodiment 1 lies in that, a second silicon nitride film layer is further deposited on the first silicon oxynitride film layer. The second silicon nitride film layer consists of three sub silicon nitride film layers, which successively are, in a direction from the aluminum oxide film layer to the first silicon nitride film layer, and from inside to outside, a first sub silicon nitride film layer, a second sub silicon nitride film layer and a third sub silicon nitride film layer. The refractive index of the second silicon nitride film layer is greater than that of the first silicon oxynitride film layer, and less than that of the first silicon nitride film layer. A refractive index of the first sub silicon nitride film layer, a refractive index of the second sub silicon nitride film layer, and a refractive index of the third sub silicon nitride film layer in the second silicon nitride film layer successively decreases.

The refractive index and thickness of each film layer successively are as follows:

The refractive index of the first silicon nitride film layer is 2.35, and the film thickness of the first silicon nitride film layer is 20 nm. The refractive index of the first silicon oxynitride film layer is 1.9, and the film thickness of the first silicon oxynitride film layer is 12 nm.

In the second silicon nitride film layer, the refractive index and thickness of each film layer successively are as follows:

The refractive index of the first sub silicon nitride film layer is 2.2, and the film thickness of the first sub silicon nitride film layer is 25 nm. The refractive index of the second sub silicon nitride film layer is 2.1, and the film thickness of the second sub silicon nitride film layer is 11 nm. The refractive index of the third sub silicon nitride film layer is 2.0, and the film thickness of the third sub silicon nitride film layer is 10 nm.

Embodiment 4

A back structure of a solar cell includes a silicon wafer substrate. The difference between this embodiment and Embodiment 3 lies in that, a second silicon oxynitride film layer is further deposited on the third sub silicon nitride film layer of the second silicon nitride film layer.

The refractive index and thickness of each film layer successively are as follows:

The refractive index of the first silicon nitride film layer is 2.35, and the film thickness of the first silicon nitride film layer is 20 nm. The refractive index of the first silicon oxynitride film layer is 1.9, and the film thickness of the first silicon oxynitride film layer is 12 nm.

In the second silicon nitride film layer, the refractive index and thickness of each film layer successively are as follows:

The refractive index of the first sub silicon nitride film layer is 2.2, and the film thickness of the first sub silicon nitride film layer is 15 nm. The refractive index of the second sub silicon nitride film layer is 2.1, and the film thickness of the second sub silicon nitride film layer is 11 nm. The refractive index of the third sub silicon nitride film layer is 2.0, and the film thickness of the third sub silicon nitride film layer is 10 nm. The refractive index of the second silicon oxynitride film layer is 1.7, and the film thickness of the second silicon oxynitride film layer is 10 nm.

Embodiment 5

A back structure of a solar cell includes a silicon wafer substrate. The difference between this embodiment and Embodiment 4 lies in that, a silicon oxide film layer is further deposited on a second silicon oxynitride film layer.

The refractive index and thickness of each film layer successively are as follows:

The refractive index of the first silicon nitride film layer is 2.35, and the film thickness of the first silicon nitride film layer is 16 nm. The refractive index of the first silicon oxynitride film layer is 1.9, and the film thickness of the first silicon oxynitride film layer is 12 nm.

In the second silicon nitride film layer, the refractive index and thickness of each film layer successively are as follows:

The refractive index of the first sub silicon nitride film layer is 2.2, and the film thickness of the first sub silicon nitride film layer is 10 nm. The refractive index of the second sub silicon nitride film layer is 2.1, and the film thickness of the second sub silicon nitride film layer is 10 nm. The refractive index of the third sub silicon nitride film layer is 2.0, and the film thickness of the third sub silicon nitride film layer is 10 nm. The refractive index of the second silicon oxynitride film layer is 1.7, and the film thickness of the second silicon oxynitride film layer is 10 nm. The refractive index of the silicon oxide film layer is 1.5, and the film thickness of the silicon oxide film layer is 10 nm.

Comparative Example 1

The difference between this comparative example 1 and Embodiment 1 lies in that, only three silicon nitride layers are deposited on an aluminum oxide film layer, which successively are, in a direction from the aluminum oxide film layer to the first silicon nitride film layer, and from inside to outside, a first sub silicon nitride film layer, a second sub silicon nitride film layer and a third sub silicon nitride film layer.

The refractive index and thickness of each film layer successively are as follows:

The refractive index of the first sub silicon nitride film layer is 2.4, and the film thickness of the first sub silicon nitride film layer is 25 nm. The refractive index of the second sub silicon nitride film layer is 2.2, and the film thickness of the second sub silicon nitride film layer is 20 nm. The refractive index of the third sub silicon nitride film layer is 2.1, and the film thickness of the third sub silicon nitride film layer is 33 nm.

A double-side PERC cell (front-side structures are the same, and the settings of front-side and back-side electrodes are the same) having the back structure of Embodiments 1-5 and Comparative example 1 is used to test the impact of each back structure on the double-side PERC cell, and results are shown in the following table.

layers and the silicon oxynitride layers, the improvement of each performance parameter of the cell can be facilitated; in particular, disposing the silicon nitride layer on the outermost side of the alternate structure can significantly promote the performance improvement of Uoc, Isc, etc., and a double-sided ratio is increased; and further disposing the silicon nitride film layer on the outermost side can be more conducive to prove the improvement of Eta.

What is claimed is:

1. A back structure of a solar cell, comprising an aluminum oxide film layer disposed on a silicon wafer substrate of the solar cell, and a first silicon nitride film layer and a first silicon oxynitride film layer, which are successively disposed on the aluminum oxide film layer from inside to outside, wherein a refractive index of the first silicon nitride film layer is greater than a refractive index of the first silicon oxynitride film layer; further comprising a second silicon nitride film layer disposed on the first silicon oxynitride film layer, wherein the refractive index of the first silicon nitride film layer is greater than a refractive index of the second silicon nitride film layer, and a refractive index of the second silicon nitride film layer is greater than the refractive index of the first silicon oxynitride film layer; further comprising a second silicon oxynitride film layer disposed on the second silicon nitride film layer; further comprising a silicon oxide film layer disposed on the second silicon oxynitride film layer; wherein the second silicon nitride film layer comprises at least one sub silicon nitride film layer; the at least one sub silicon nitride film layer comprises a first sub silicon nitride film layer, a second sub silicon nitride film layer and a third sub silicon nitride film layer, which are successively disposed on the first silicon oxynitride film layer from inside to outside; a refractive index of the first sub silicon nitride film layer is 2.1-2.2, and a film thickness of the first sub silicon nitride film layer is 15-25 nm; a refractive index of the second sub silicon nitride film layer is 2.0-2.1, and a film thickness of the second sub silicon nitride film layer is 8-15 nm; a refractive index of the third sub silicon nitride film layer is 1.9-2.0, and a film thickness of the third sub silicon nitride film layer is 8-15 nm.

2. The back structure of a solar cell as claimed in claim 1, wherein the refractive index of the first silicon nitride film layer is 2.3-2.4, and a film thickness of the first silicon nitride film layer is 10-25 nm; and the refractive index of the first silicon oxynitride film layer is 1.7-1.9, and a film thickness of the first silicon oxynitride film layer is 10-20 nm.

| | Back structure of PERC cell: AlOx+ | | Eta/% | Uoc/mV | Isc/A | FF/% | Double-sided ratio/% |
|---|---|---|---|---|---|---|---|
| Embodiment 1 | SiNx + SiONx | Front side | 22.76 | 683.6 | 10.333 | 81.22 | 77.45 |
| Embodiment 2 | SiNx + SiONx + SiNx | Front side | 22.77 | 684.0 | 10.332 | 81.20 | 77.01 |
| Embodiment 3 | SiNx + SiONx + three-layer SINx | Front side | 22.79 | 684.4 | 10.340 | 81.13 | 77.03 |
| Embodiment 4 | SiNx + SiONx + three-layer SiNx + SiONx | Front side | 22.79 | 684.5 | 10.330 | 81.23 | 77.75 |
| Embodiment 5 | SiNx + SiONx + three-layer SiNx + SiONx + SiOx | Front side | 22.80 | 684.7 | 10.340 | 81.10 | 78.45 |
| Comparative example 1 | Three-layer SiNx | Front side | 22.74 | 684.2 | 10.332 | 81.02 | 76.50 |

According to the technical solution of the present disclosure, by means of alternately arranging the silicon nitride 3. The back structure of a solar cell as claimed in claim 1, wherein a refractive index of the second silicon oxynitride film layer is 1.7-2.0, and a film thickness of the second silicon oxynitride film layer is 8-15 nm.

4. The back structure of a solar cell as claimed in claim 3, wherein a refractive index of the silicon oxide film layer is 1.5-1.6, and a film thickness of the silicon oxide film layer is 8-15 nm.

5. A PERC solar cell, comprising a back structure of a solar cell, wherein the back structure of a solar cell is the back structure of a solar cell as claimed in claim 1.

6. The back structure of a solar cell as claimed in claim 5, wherein the refractive index of the first silicon nitride film layer is 2.3-2.4, and a film thickness of the first silicon nitride film layer is 10-25 nm; and the refractive index of the first silicon oxynitride film layer is 1.7-1.9, and a film thickness of the first silicon oxynitride film layer is 10-20 nm.

7. The PERC solar cell as claimed in claim 5, further comprising a second silicon oxynitride film layer disposed on the second silicon nitride film layer, wherein a refractive index of the second silicon oxynitride film layer is 1.7-2.0, and a film thickness of the second silicon oxynitride film layer is 8-15 nm.

8. The PERC solar cell as claimed in claim 7, further comprising a silicon oxide film layer disposed on the second silicon oxynitride film layer, wherein a refractive index of the silicon oxide film layer is 1.5-1.6, and a film thickness of the silicon oxide film layer is 8-15 nm.

9. A TOPCon solar cell, comprising a back structure of a solar cell, wherein the back structure of a solar cell is the back structure of a solar cell as claimed in claim 1.

10. The back structure of a solar cell as claimed in claim 9, wherein the refractive index of the first silicon nitride film layer is 2.3-2.4, and a film thickness of the first silicon nitride film layer is 10-25 nm; and the refractive index of the first silicon oxynitride film layer is 1.7-1.9, and a film thickness of the first silicon oxynitride film layer is 10-20 nm.

11. The TOPCon solar cell as claimed in claim 9, further comprises:

a second silicon oxynitride film layer, disposed on the second silicon nitride film layer, wherein the refractive index of the second silicon oxynitride film layer is 1.7-2.0, and a film thickness of the second silicon oxynitride film layer is 8-15 nm; and a silicon oxide film layer, disposed on the second silicon oxynitride film layer, wherein a refractive index of the silicon oxide film layer is 1.5-1.6, and a film thickness of the silicon oxide film layer is 8-15 nm.

* * * * *